(12) United States Patent
Van Empel et al.

(10) Patent No.: US 7,728,951 B2
(45) Date of Patent: Jun. 1, 2010

(54) LITHOGRAPHIC APPARATUS AND METHOD FOR CONDITIONING AN INTERIOR SPACE OF A DEVICE MANUFACTURING APPARATUS

(75) Inventors: Tjarko Adriaan Rudolf Van Empel, Eindhoven (NL); Ronald Van Der Ham, Maarheeze (NL); Niek Jacobus Johannes Roset, Vlijmen (NL)

(73) Assignee: ASML Netherlands B.V., Veldhoven (NL)

( * ) Notice: Subject to any disclaimer, the term of this patent is extended or adjusted under 35 U.S.C. 154(b) by 1280 days.

(21) Appl. No.: 11/238,156

(22) Filed: Sep. 29, 2005

(65) Prior Publication Data

US 2007/0071889 A1    Mar. 29, 2007

(51) Int. Cl.
G03B 27/52 (2006.01)
G03B 27/68 (2006.01)
G03B 27/42 (2006.01)
G03B 27/58 (2006.01)

(52) U.S. Cl. .............................. 355/30; 355/52; 355/53; 355/72

(58) Field of Classification Search .................. 355/30, 355/51, 72–75, 52, 53, 55, 67–71; 250/492.1, 250/492.2, 492.22, 548
See application file for complete search history.

(56) References Cited

U.S. PATENT DOCUMENTS

| | | | | |
|---|---|---|---|---|
| 4,233,123 A | * | 11/1980 | Hammer, Jr. | 205/667 |
| 4,814,625 A | * | 3/1989 | Yabu | 250/548 |
| 5,469,260 A | * | 11/1995 | Takagi et al. | 356/500 |
| 6,020,964 A | * | 2/2000 | Loopstra et al. | 356/500 |
| 6,750,946 B2 | * | 6/2004 | Tanaka et al. | 355/30 |
| 7,050,149 B2 | * | 5/2006 | Owa et al. | 355/30 |
| 2002/0191163 A1 | * | 12/2002 | Hasegawa et al. | 355/30 |
| 2006/0139594 A1 | * | 6/2006 | Hara et al. | 355/53 |

FOREIGN PATENT DOCUMENTS

| | | |
|---|---|---|
| EP | 0 498 499 A1 | 8/1992 |
| EP | 1 347 336 A1 | 9/2003 |
| EP | 1 536 458 A1 | 6/2005 |
| EP | 1 600 818 A1 | 11/2005 |
| JP | 2000-036453 | 2/2000 |
| WO | WO 03105203 A1 * | 12/2003 |

OTHER PUBLICATIONS

English translation of WO2003-105203, published Dec. 18, 2003.*
European Search Report issued for European Patent Application No. 06076806.6-2222, dated Feb. 12, 2007.

* cited by examiner

Primary Examiner—Peter B Kim
Assistant Examiner—Christina Riddle
(74) Attorney, Agent, or Firm—Sterne, Kessler, Goldstein & Fox P.L.L.C.

(57) ABSTRACT

A lithographic apparatus is disclosed that includes a first gas shower configured to supply a first gas flow to an interior space of the apparatus, and a second gas shower configured to supply a second gas flow to the interior space of the apparatus, the gas showers configured to direct the first gas flow and the second gas flow at least partly towards each other. Also, a method for conditioning an interior space of a device manufacturing apparatus is provided that includes supplying a first conditioned gas flow and a second conditioned gas flow to the interior space, such that the first conditioned gas flow and the second conditioned gas flow are at least partly directed to each other.

52 Claims, 5 Drawing Sheets

LITHOGRAPHIC APPARATUS AND METHOD FOR CONDITIONING AN INTERIOR SPACE OF A DEVICE MANUFACTURING APPARATUS

FIELD

The present invention relates to a lithographic apparatus and a method for conditioning an interior space of a device manufacturing apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning structure, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning structure to the substrate by imprinting the pattern onto the substrate.

The application of gas showers is known from the art. For example, European patent EP 0 498 499 illustrates, in FIG. 18 thereof, a part of a lithographic apparatus. The apparatus includes an interferometer system and a space in which the interferometer beams propagate. A constant, preferably laminar, stream of air is passed through this space to obtain a greater accuracy of the interferometer system. Both the purity and the temperature of the supplied air may be controlled. The air may be, for example, of purity class 1 and its temperature may be, for example, stable within 0.10 degrees C.

SUMMARY

Accordingly, it is desirable to provide a lithography apparatus, wherein the conditioning of at least part of the interior, and/or optical paths, in the apparatus may be improved.

According to an aspect of the invention, there is provided a lithographic apparatus, comprising a first gas shower configured to supply a first gas flow to an interior space of the apparatus, and a second gas shower configured to supply a second gas flow to the interior space of the apparatus, the gas showers configured to direct the first gas flow and the second gas flow at least partly towards each other.

According to an aspect of the invention, there is provided a lithographic apparatus, comprising an apparatus component having a first side and a second side facing away from the first side, and a gas shower system configured to supply a first gas flow at least partially towards the first side of the apparatus component, and to supply a second gas flow at least partially towards the second side of the apparatus component.

According to an aspect of the invention, there is provided a method for conditioning an interior space of a device manufacturing apparatus, comprising supplying a first conditioned gas flow and a second conditioned gas flow to the interior space, such that the first conditioned gas flow and the second conditioned gas flow are at least partly directed to each other.

According to an aspect of the invention, there is provided a method for conditioning an interior space of a device manufacturing apparatus, comprising at least partially directing a first gas flow towards a first side of an apparatus component, and at least partially directing a second gas flow towards a second side of the apparatus component, wherein the second side faces away from the first side.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
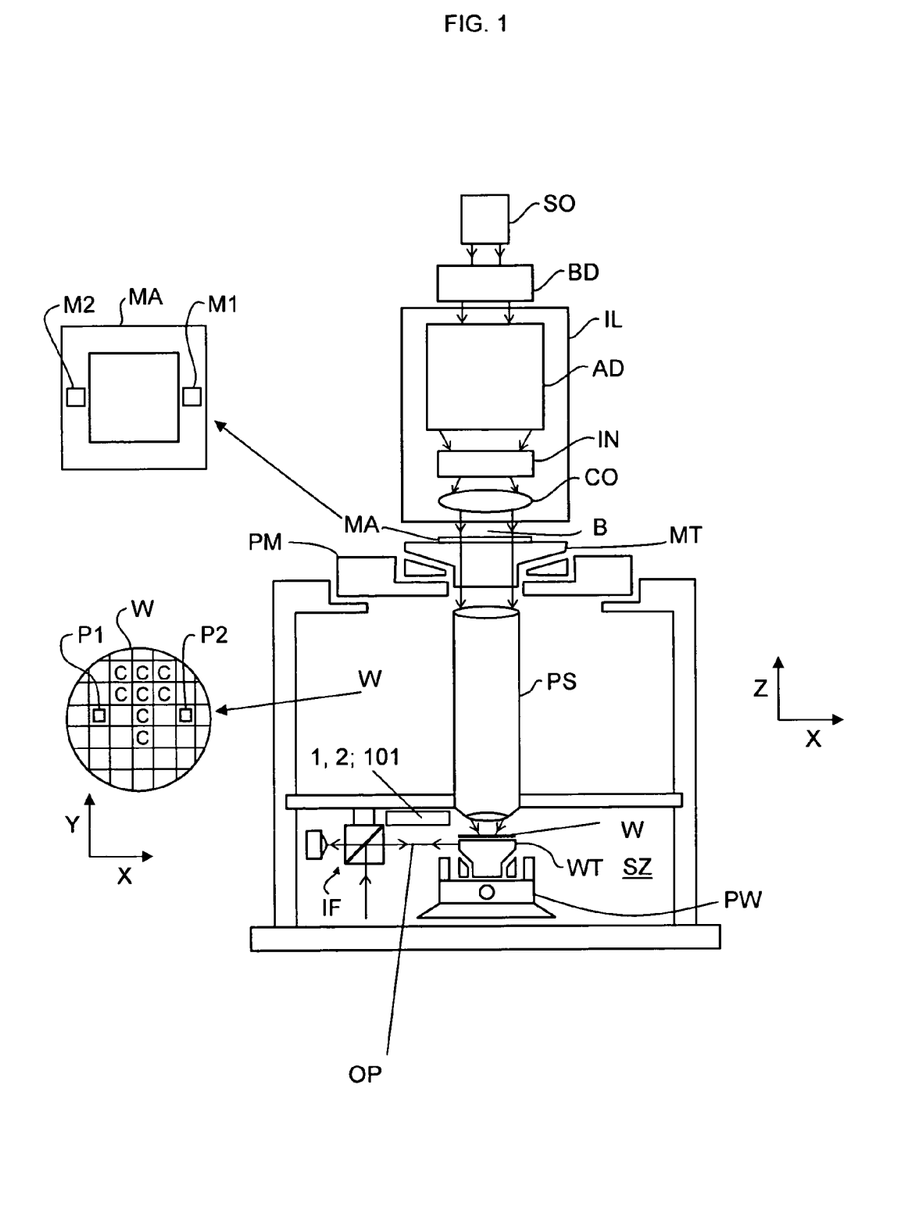
FIG. 1 depicts a lithographic apparatus according to an embodiment of the invention.

FIG. 1 schematically depicts a lithographic apparatus according to an embodiment of the invention. The apparatus comprises:

an illumination system (illuminator) IL configured to condition a radiation beam B (e.g. UV radiation or a different type of radiation);

a support structure (e.g. a mask table) MT constructed to support a patterning structure (e.g. a mask) MA and connected to a first positioner PM configured to accurately position the patterning structure in accordance with certain parameters;

a substrate zone SZ comprising a substrate table or substrate support (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning structure MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure holds the patterning structure in a manner that depends on the orientation of the patterning structure, the design of the lithographic apparatus, and other conditions, such as for example whether or not the patterning structure is held in a vacuum environment. The support structure can use mechanical, vacuum, electrostatic or other clamping techniques to hold the patterning structure. The support structure may be a frame or a table, for example, which may be fixed or movable as required. The support structure may ensure that the patterning structure is at a desired position, for example with respect to the projection system. Any use of the terms "reticle" or "mask" herein may be considered synonymous with the more general term "patterning structure."

The term "patterning structure" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning structure may be transmissive or reflective. Examples of patterning structures include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more support structures). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the patterning structure and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning structure (e.g., mask) MA, which is held on the support structure (e.g., mask table) MT, and is patterned by the patterning structure. Having traversed the patterning structure MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning structure MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning structure MA and substrate W may be aligned using patterning structure alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning structure MA, the patterning structure alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning structure, and the substrate table WT is moved or scanned while a pattern imparted to the radiation beam is projected onto a target portion C. In this mode, generally a pulsed radiation source is employed and the programmable patterning structure is updated as required after each movement of the substrate table WT or in between successive radiation pulses during a scan. This mode of operation can be readily applied to maskless lithography that utilizes programmable patterning structure, such as a programmable mirror array of a type as referred to above.

Combinations and/or variations on the above described modes of use or entirely different modes of use may also be employed.

In an embodiment, the apparatus includes one or more interferometer systems IF, as well as one or more gas showers arranged to supply laminar gas to at least part of an optical path OP of the interferometer system IF. This is depicted schematically in FIGS. 1 to 9.

Figure 2:
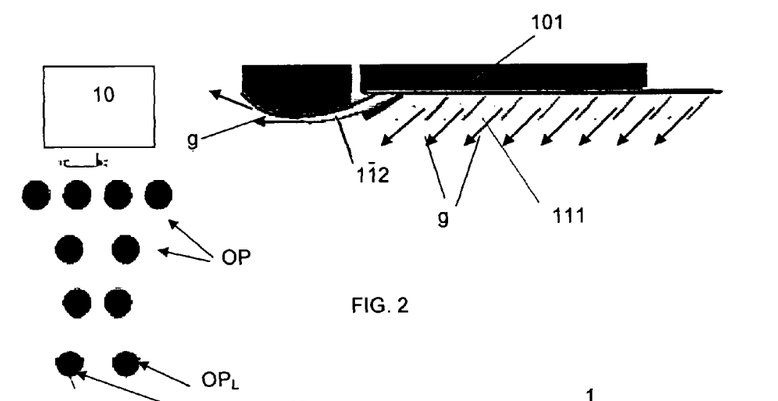
FIG. 2 schematically depicts part of a conventional gas shower system, in cross-section.

FIG. 2 depicts part of a conventional gas shower system to condition part of the interior of the apparatus, for example a part of a substrate zone SZ of the apparatus (see FIG. 1) which is traversed by substantially parallel paths OP of optical beams. In FIG. 2, the beam paths OP are shown in cross-section, and extend perpendicular to the plane of the drawing. The respective beams may be, for example, interferometer beams of an interferometer positioning system. The interferometer system may be, for example, similar to the system described in European patent EP 0 498 499, or be configured differently. For example, the optical paths OP may be paths of interferometer beams to position a substrate table or substrate support in an XY-plane (see FIG. 1), or in a different direction. For example, as has been described above, the apparatus may comprise a substrate support which is moveable in an X- and/or Y-direction with respect to a projection system. The interferometer system may be a system for providing X- and/or Y-positioning of such a movable substrate support. The X- and Y-directions may be orthogonal directions.

As FIG. 2 depicts, a component 10 of the apparatus extends near (above in the drawing) the optical paths OP. Therefore, this component 10 occupies part of the space near the optical paths OP. This apparatus component 10 may extend, for example substantially all along the optical paths OP (viewed in a direction perpendicular to the plane of the drawing). Also, the component 10 may extend substantially parallel to the nearby optical beam paths OP (see also FIG. 4, concerning the embodiment described below). For example, this component 10 may be a mirror, for example an elongated mirror which may be installed to provide a positioning of a substrate holder in a transversal direction with respect to the optical paths OP, for example a Z-direction which is orthogonal to the X- and Y-direction. Also, this component 10 that extends near (above, in the Figures) the optical paths OP may be, for example, a sensor, or a different apparatus component.

In a conventional apparatus, a gas shower extends 101 next to the apparatus component 10, to supply a respective flow of conditioned gas to the interior space. The conditioned gas may be, for example, an inert gas, a gas mixture, air, or a different gas. The conditioned gas may be ultra clean air of purity class 1. The temperature of the gas may be relatively stable, for example, stable within 0.10 degrees C. or stable within 0.0010 degrees C. It is known from the prior art how such a thermally stable gas may be provided.

In FIG. 2, the gas flow is depicted by arrows g. For example, the gas shower 101 may extend substantially all along the optical paths OP (viewed in a direction perpendicular to the drawing), and/or, for example, substantially all along the length of the component 10, depending on the length of component 10 with respect to the length of the optical paths OP. Also, as an example, the gas shower 101 may extend between a projection system PS and an interferometer "block" IF (see FIG. 1), depending on the arrangement and orientation of the optical paths OP. For example, the gas shower 101 does not extend on a side of the substrate support WS or projection system PS that faces away from the part of the interferometer system IF. Thus, in the present embodiments, the gas shower 101 extends substantially along on one lateral side of the projection system PS.

The gas shower system may be used to condition the paths OP of the interferometer beams to 0.001 degrees C. stability. Because of the location of the apparatus component 10, the gas shower 101 may not condition the optical paths OP from above (in FIG. 2). In a conventional system, the gas shower 101 is equipped with inclined and diverging vanes 111 plus a curved vane 112, to bend gas around the component 10 to condition the optical beams (this is comparable to airplane flap technology).

Figure 3:
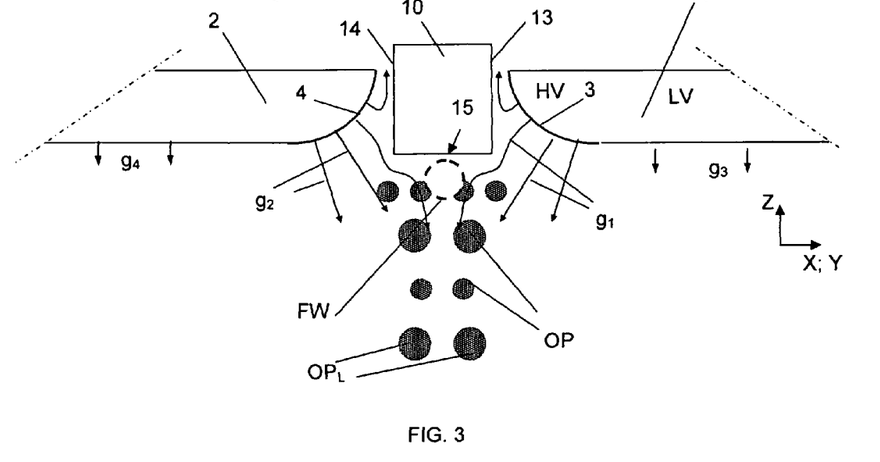
FIG. 3 schematically depicts part of a gas shower system according to an embodiment of the invention.
Figure 4:
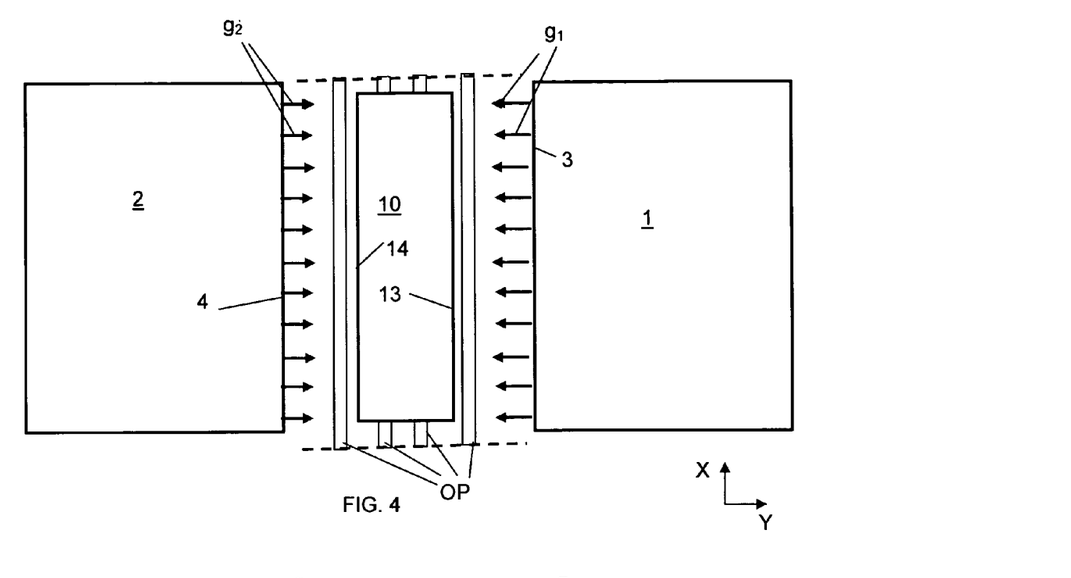
FIG. 4 schematically depicts a top view of FIG. 3.

FIGS. 3 and 4 depict an embodiment, which differs from the embodiment shown in FIG. 2, in that the apparatus includes a gas shower system comprising a first gas shower 1 which is configured to supply a first substantially laminar gas flow g1 to the interior space of the apparatus, and a second gas shower 2 which is configured to supply a second substantially laminar gas flow g2 to the interior space. Both the first and second gas flows g1, g2 may be, for example, the above-mentioned conditioned gas.

In the embodiment of FIGS. 3 and 4, the component 10 of the apparatus extends at least partially between opposite gas outlet sides 3, 4 of the first and second gas showers 1, 2. The component 10 abuts or is located near the region that is traversed by substantially parallel parts of the interferometer beams. As in the embodiment of FIG. 2, the component 10 may be, for example, a mirror which can be used in the positioning of a substrate support WT, a sensor, or a different component. In a further embodiment, component 10 is provided for positioning a substrate support WT in a Z-direction (see FIGS. 1 and 2).

In the present embodiment, the apparatus component is provided with a first side 13 and a second side 14. The second side 14 of the component 10 substantially faces away from the first side 13. Also, the apparatus component 10 may comprise a third side 15 extending between the first and second sides 13, 14. For example, in an embodiment, the third side 15 comprises a mirror surface, to reflect one or more positioning beams (not depicted). For example, the apparatus component 10 may have a substantially rectangular or square cross-section, or be shaped differently.

As is shown, the gas shower system 1, 2 is configured to supply the first gas flow g1 at least partially towards the first side 13 of the apparatus component 10 and to supply the second gas flow g2 at least partially towards the second side 14 of the apparatus component 10. Particularly, opposite sides 3, 4 of the gas showers 1, 2 are configured to supply the first and second gas flows. Also, in the present embodiment, at least part of the first and second gas flows g1, g2 meet each other in front of the third side 15 of the apparatus component 10 during use, particularly to condition the optical paths OP. Other parts of the gas flows g1, g2 may be directed in an opposite direction, for example along the apparatus component 10, away from the optical paths OP, as is clearly depicted in FIG. 3.

In the present embodiment, the first and second gas showers 1, 2 of the gas shower system may be arranged such, that the first gas flow g1 and the second gas flow g2 are at least partly directed toward each other, as is clearly visible in FIG. 3, and towards the further apparatus component 10 which extends between, or reaches between, the gas showers 1, 2.

In an assembly, the two gas showers 1, 2 may be spaced-apart from each other. Each of the gas showers 1, 2 may be spaced-apart from the apparatus component 10. In an embodiment, the gas showers 1, 2 extend between a projection system PS and an interferometer "block" IF (see FIG. 1), depending on the arrangement and orientation of the optical paths OP. For example, in an embodiment, the gas showers 1, 2 do not extend on a side of the substrate support WS or projection system PS that faces away from the part of the interferometer system IF. Thus, in the present embodiment, the gas showers 1, 2 may extend substantially on a lateral side of the projection system PS. In another embodiment, assemblies of gas showers 1, 2 extend on various sides of the substrate support WS or projection system PS, depending for example on the arrangement of the interferometer system. In that case, gas showers 1, 2 may extend on more than one lateral side of the projection system PS, for example on opposite lateral sides of the projection system PS.

In FIGS. 3 and 4, the two gas showers 1, 2 extend substantially parallel with respect to each other, and substantially parallel with respect to the respective parallel optical paths OP to be conditioned by the gas flows. As in the conventional apparatus, in FIGS. 3 and 4, the apparatus may comprise one or more interferometer systems configured to position at least part of the apparatus (such as a substrate holder) utilizing one or more interferometer beams, wherein the first gas shower 1 is configured to supply at least part of the first gas flow g1 to the region which is traversed by the interferometer beam. In FIGS. 3 and 4, the second gas shower 2 is configured to supply at least part of the second gas flow g2 to that region.

Each of the gas showers 1, 2 may be arranged and configured in various ways. For example, each gas shower 1, 2 may include one or more suitable gas outlet sides 3, 4 to disperse laminar gas flows g1, g2 into the apparatus. Each of the outlet sides 3, 4 may be provided, for example, with a porous material, a suitable gas disperser, monofilament cloth, one or more sheets having gas apertures, or a different gas distributor. Each gas shower outlet sides 3, 4 may include one or more layers of one or more materials. The outlet sides 3, 4 may be, or provide, a wall or wall part of an upstream gas distribution chamber of the respective gas showers 1, 2. In the present embodiment of FIGS. 3 and 4, during use, the gas flows g1, g2 flow substantially perpendicularly from the respective outlet sides 3, 4.

In an embodiment, each gas shower 1, 2, or respective gas outlet side 3, 4, is configured to generate a substantially uniform laminar gas flow g from gas that is being supplied to the gas shower during use. One or more gas sources to supply gas to the gas showers 3, 4 are not depicted. In the present embodiment of FIGS. 3 and 4, each gas shower 1, 2 may include a high-velocity part HV and an upstream low velocity part LV. The high velocity part may be located near the opposite gas outlet sides 3, 4 of the gas showers 1, 2. In the present embodiment, gas of a relatively high velocity (for example about 1 m/s or a different velocity) may be ejected from these high velocity parts, via the opposite gas outlet sides 3, 4 to the interior space. Optionally, upstream low velocity gas shower parts may be arranged to feed gas to the interior space, as has been depicted by arrows g3, g4.

In an embodiment, the opposite gas outlet sides 3, 4 of the first and second gas showers 1, 2 may be arranged to direct the first gas flow g1 and the second gas flow g2 at least towards each other, as in the present embodiment, and towards the first and second sides 13, 14 of the component 10. For example, in the present embodiment, the opposite gas outlet sides 3, 4 of the gas showers 1, 2 are arranged respectively to supply diverging gas flows g1, g2 to the interior space. Herein, each gas flow g1, g2 as such diverges at least partly. For example, each gas flow g1, g2 may be diverging when viewed in a virtual plane which is perpendicular to respective optical paths OP, for example a XZ or YZ plane. Each diverging gas flow g1, g2 can reach a respective side 13, 14 of the apparatus component 10, as well as the optical paths OP that are located near that apparatus component 10. To provide diverging gas flows g1, g2, the opposite sides 3, 4 of the first and second gas shower may simply be curved surfaces, such as convex surfaces as shown in FIG. 3, and be provided with a suitable gas distributor or gas dispersing material, as has been described above. For example, the outer side of each gas shower 1, 2 can include a convex gas distribution edge or tip, which edge or tip is at least faces towards the nearby apparatus component 10, and towards the optical paths OP extending in front of the third side 15 of the apparatus component 10. The opposite gas outlet sides 3, 4 may be arranged in various other ways, and may have, for example, tapered tips, inclined gas passages (see below), or a different configuration. Alternatively, as has been depicted in FIG. 8 (see below), one or both gas showers may be configured to provide a respective converging gas flow, or a collimated (parallel) gas flow, or in a different way.

In an embodiment, the first and second gas showers 1, 2 may be configured to induce one or more flow wakes (or underpressure) in the interior space. In the present embodiment of FIGS. 3 and 4, the flow wake may be induced near the component 10. A location of the wake is depicted with a dashed circle FW in FIG. 3. The wake FW may, for example, be induced near the component 10, for example between the component 10 and the optical paths OP, and/or in front of the third side of the component 10. The wake FW may also extend at least partially in the optical paths OP. In an embodiment, the first and second gas flows g1, g2 may be directed such that the respective wake area is substantially closed in between these gas flows g1, g2 and the apparatus component 10.

During use of the embodiment of FIGS. 3 and 4, an interior space of the apparatus, which space can be traversed by interferometer beams, may be conditioned. In an embodiment, the first conditioned gas flow g1 and the second conditioned gas flow g2 may be supplied to the interior space, such that the first conditioned gas flow and the second conditioned gas flow are at least partly directed to each other, and towards the first and second side of the apparatus component 10. Also, for example, during use, the first and second gas flows may meet near the apparatus component 10 to condition the area which is traversed by interferometer beams. Also, for example, during use, the first and second gas flows may induce the above-mentioned flow wake FW, or underpressure, in the interior space. In an embodiment, the first and second gas flows are substantially mirror-symmetrical with respect to each other, viewed, for example, from the apparatus component 10. For example, the flow rates of the gas flows g1, g2 may be substantially the same. Alternatively, the gas flows g1, g2 may be different, may have different flow rates and/or somewhat different flow directions with respect to each other. As an example, the first and second gas showers 1, 2 may be substantially the same to provide substantially similar respective gas flows (but with mirror symmetrical flow directions). Alternatively, the first and second gas showers 1, 2 may arranged differently, and/or be used to provide gas flows that are asymmetrical, viewed from the apparatus component 10.

Figure 5:
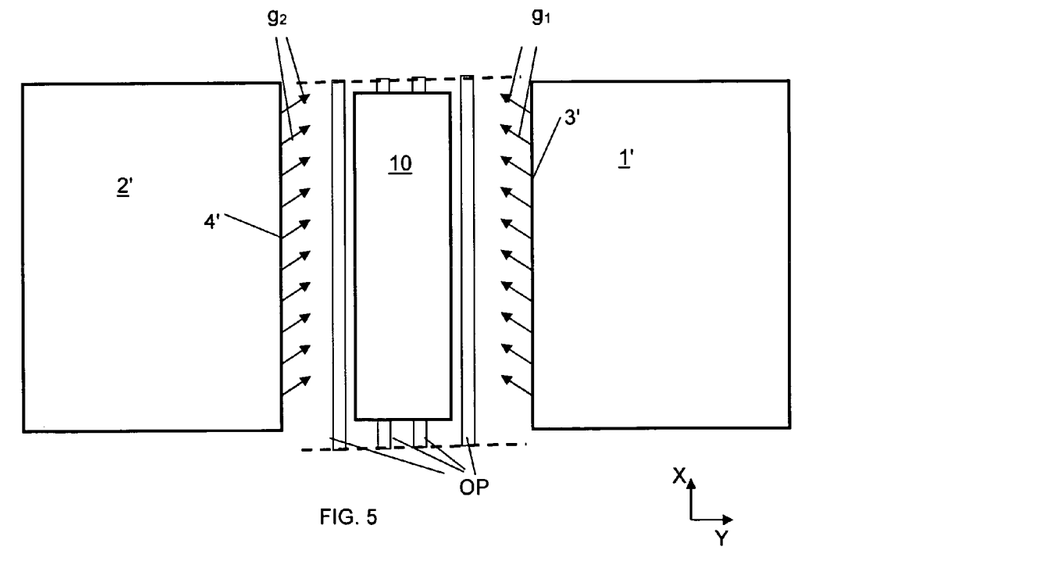
FIG. 5 is a similar view as in FIG. 4 of an alternate embodiment.
Figure 6:
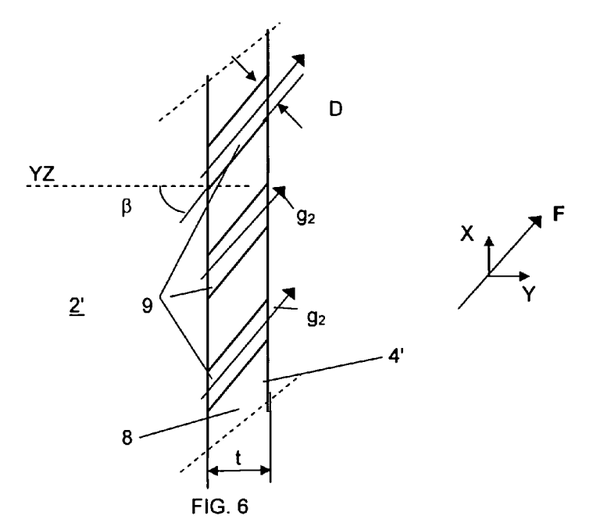
FIG. 6 schematically depicts a detail of a gas outlet side, in cross-section, of a gas shower system according to an embodiment.

FIGS. 5 and 6 depict an embodiment which differs from the embodiment shown in FIGS. 3 and 4 in that the respective gas outlet sides 3', 4' of each of the gas showers 1', 2', are arranged to direct the respective gas flows g1, g2 at a certain angle into the interior space. Particularly, during use, the gas flows g1, g2 do not flow substantially perpendicularly from the respective outlet sides 3', 4', but include an angle β smaller than 90 degrees with respect to that side. Each of the gas flows by itself may still be a diverging gas flow, such as is depicted in FIG. 3, for example diverging when viewed in a virtual plane which is perpendicular to the optical paths OP, for example a XZ plane or YZ plane. However, with respect to each other, the two gas flows may at least partly converge, or join each other (see also FIG. 3). For example, passages 9 may be at an angle β with the shower outlet side, the angles being in the range of about 20-80 degrees. As an example, the angles may be in the range of about 45-55 degrees.

In the present FIGS. 5 and 6, the gas passages 9 may, for example, include the angle β with respect to a virtual (vertical) YZ plane, which plane extends perpendicularly with respect to the optical paths OP.

The respective gas showers 1', 2' may be constructed in various ways to provide the respective inclined gas flows. For example, each gas shower 1', 2' may comprise a gas outlet side 3', 4', comprising a plurality of inclined gas passages, as is shown in detail in FIG. 6 (showing part of the gas outlet side 4' of the second gas shower 2'). The gas outlet sides 3', 4' may comprise a sheet 8 having a plurality of inclined passages 9, each passage extending substantially obliquely through the sheet. For example, the sheet 8 may be a metal sheet or an alloy sheet, wherein the passages 9 are laser drilled passages, etched passages and/or passages manufactured by electric discharge machining.

In an embodiment, each gas outlet side 3', 4' may comprise a thin metal or alloy sheet 8 having a plurality of passages 9, each of the passages 9 extending obliquely with respect to an outer surface of the metal sheet. Also, a plurality of the passages may extend substantially parallel with respect to each other.

In an embodiment, a thickness t of the sheet 8 (measured in a Y direction in FIG. 6) may be smaller than about 1 mm. For example, the thickness t may be about 0.5 mm or smaller. Also, the sheet 8 may be a metal sheet or an alloy sheet, for example stainless steel, or grown nickel, or an alloy on a pattern. In that case, relatively small gas passages 9 may be manufactured with high accuracy using laser drilling. Gas passages 9 may also be manufactured using different techniques. Alternatively or additionally, the sheet 8 may be made of plastic, and/or one or more different materials. Besides laser drilling, different manufacturing methods may be applied to provide the passages 9, such as etching the passages, manufacturing the passages by electric discharge machining, and/or using different processes.

The gas passages 9 may have various diameters or dimensions. A diameter or width D of each of the passages 9 may be, for example, smaller than about 0.2 mm. For example, the diameter or width may be smaller than about 0.1 mm. Good results may be obtained when the diameter or width of each of the passages is about 0.08 mm.

In an embodiment, the lithographic apparatus may include a movable substrate support WT. For example, in the embodiment of FIG. 5, a substrate support WT (see FIG. 1) may be movable in a X direction. In that case, in an embodiment, the gas showers 1', 2' are arranged to direct the laminar gas at least partly in the same direction as a direction of movement X of the substrate support WT. As is shown in FIG. 5, for example, the inclined gas passages 9 may provide gas flows having a flow direction F with a component which is substantially parallel to the X direction, and a component which is perpendicular with respect to the gas outlet side 4'. In this way, the gas shower system 1', 2' may prevent or diminish the occurrence of a (further) wake behind the substrate support, when the substrate support WT moves away from, for example, an interferometer block IF. In this way, a so called 'first scan effect', wherein relatively unconditioned gas is sucked from the substrate zone SZ into interferometer beam paths OP due to a first scan movement of a substrate support, may be diminished or avoided.

Figure 7:
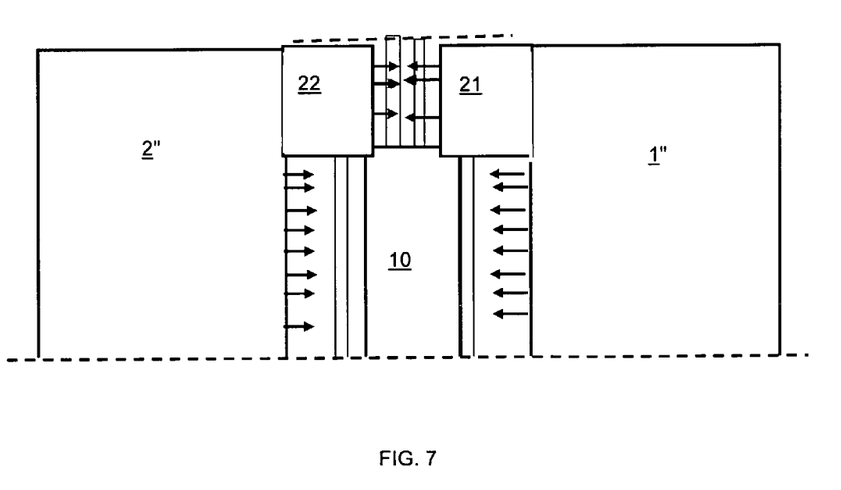
FIG. 7 is a schematic top view of part of a further embodiment.

FIG. 7 is a similar view as FIG. 4 of part of a further embodiment. In FIG. 7, the two gas showers 1", 2" are provided with respective end parts 21, 22 that are located close to each other. The end parts extend, for example, opposite one of the ends of the apparatus component 10, for example an end of the apparatus component 10 that faces away from a projection system PS and/or substrate table WT (se FIG. 1). For example, the gas showers 1", 2" may substantially enclose the end of the apparatus component 10.

Figure 8:
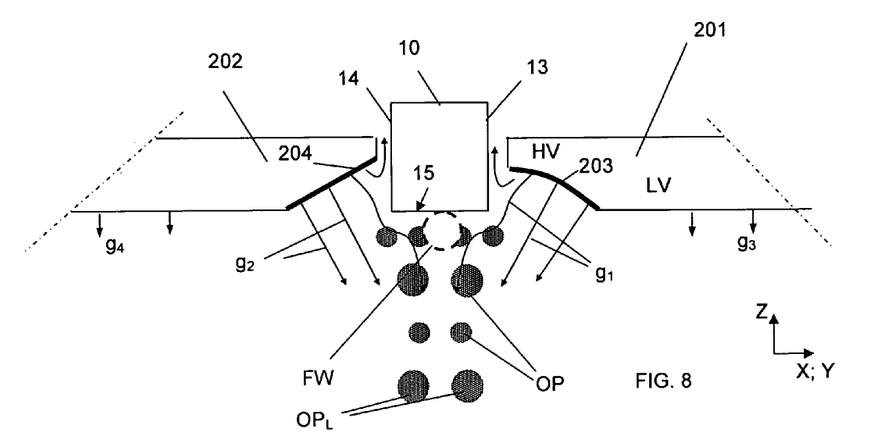
FIG. 8 is similar to FIG. 3 of another embodiment.

FIG. 8 depicts part of another embodiment. The embodiment of FIG. 8 differs from the embodiment shown in FIG. 3, in that one of the gas outlet sides—gas outlet side 203—of one of the gas showers—gas shower 201—is configured to provide a converging gas flow g1. To this end, for example, the gas outlet side 203 of gas shower 201 may simply be a suitably curved surface, such as a concave surface, as is shown in FIG. 8, and be provided with a suitable gas distributor or gas dispersing material, as has been described above. For example, the gas outlet side 203 may include a concave gas distribution edge or tip, which edge or tip is at least faces towards the nearby apparatus component 10, and towards the optical paths OP extending in front of the third side 15 of the apparatus component 10. For example, the converging gas flow g1 may be converging when viewed in a virtual plane perpendicular to the optical paths OP, for example a XZ or YZ plane.

In the embodiment of FIG. 8, one of the gas outlet sides—gas outlet side 204—of the gas showers—gas shower 202—is configured to provide a collimated gas flow g2, for example a gas flow g2 of substantially parallel flow components when leaving the gas shower 202. To this end, for example, the gas outlet side 204 of gas shower 202 may simply be a substantially flat surface, as is shown in FIG. 8, and be provided with a suitable gas distributor or gas dispersing material, as has been described above. Such a flat gas outlet side 204 may also be at least facing towards the nearby apparatus component 10, and towards the optical paths OP extending in front of the third side 15 of the apparatus component 10. For example, the collimated gas flow g2, may be collimated (or substantially parallel by itself) when viewed in a virtual plane perpendicular to the optical paths OP, for example a XZ or YZ plane.

In the embodiment of FIG. 8, each of the gas outlet sides 203, 204 may be provided, for example, with a porous material, a suitable gas disperser, mono filament cloth, one or more sheets having gas apertures, or a different gas distributor.

Each gas outlet side 203, 204 may include one or more layers of one or more materials. The gas outlet side 203, 204 may be, or provide, a wall or wall part of an upstream gas distribution chamber of the respective gas showers 201, 202. For example, during use, the gas flows g1, g2 may flow substantially perpendicularly from the respective outlet sides 203, 204.

The opposite gas outlet sides 3, 4, 203, 204 may be arranged in various other ways. For example, both of the opposite gas outlet sides may be flat sides, or concave sides. One of the gas outlet sides may be substantially flat or concave (as in FIG. 8), whereas the opposite gas outlet side of the opposite gas shower may be concave, or be configured to provide an at least partially diverging gas flow (as in FIG. 3).

Also, the embodiment of FIG. 8 may be combined, for example, with the embodiment shown in FIG. 4, particularly concerning the flow directions of the gas flows g1, g2. The FIG. 8 embodiment may also or alternatively be combined with the embodiment of FIGS. 5 and 6, wherein the gas outlet sides 203, 204 of one or both of the gas showers 201, 202 may be arranged to direct the respective gas flows g1, g2 at a certain angle into the interior space (for example, by providing respective gas outlet sides 203, 204 with inclined gas passages, as has been described above).

The embodiments shown in FIGS. 2 to 8 may prevent or diminish mixing of conditioned gas shower system gases with "ambient" gases, for example less-conditioned substrate zone SZ gas. Deceleration of laminar shower gases may also be prevented in this way. This may lead to a reduction of the mixing of conditioned shower gases with ambient gases. Therefore, the gas showers described herein may lead to good conditioning of an interior (or part thereof) of the apparatus, particularly to condition interferometer beam paths OP. For example, mixing of unconditioned gases into lower positioned interferometer beams which are relatively remote from the apparatus component 10 (see for example FIG. 3) may be prevented relatively well. Paths of these 'lower' interferometer beams are indicated by $OP_L$ in FIGS. 2, 3 and 8.

The gas showers described herein may provide two gas supply areas, one on each side 13, 14 of the apparatus component 10. As follows from the above, the surface or gas outlet side of each supply part of each gas shower may be covered or provided with a mono filament cloth to generate a uniform laminar 'down' flow of a certain velocity. The gas outlet sides of the gas showers may, for example, be positioned at an inclined angle towards the apparatus component 10, such that potential mixing zones of low momentum and unconditioned gas may be located outside interferometer paths OP, and such that a flow wake FW under the apparatus component 10 is minimal. Slight amounts of unconditioned gas may be sucked into this flow wake FW, particularly at outer ends of the apparatus component 10, for example near an interferometer part IF and near the projection system PS (see FIG. 1). To further limit the entrainment of unconditioned gas, the gas shower assembly 1, 2 may enclose substantially the entire end of the apparatus component 10 (for example as in FIG. 7), for example at the interferometer part side.

Figure 9:
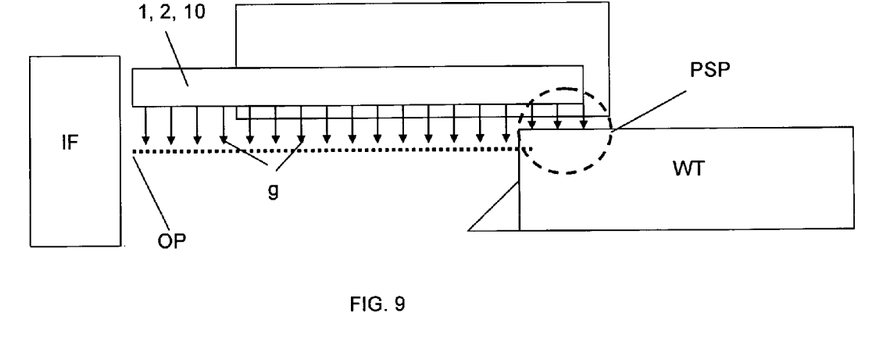
FIG. 9 schematically depicts part of an embodiment, in side view.

In an embodiment, near the projection system PS, a top surface of the substrate support may be configured to induce a pressure stagnation point PSP, for example in cooperation with lateral end parts of the gas showers 1, 2. Such a pressure stagnation point PSP may avoid or reduce entrainment of unconditioned gas into interferometer paths OP. This is schematically depicted in FIG. 9, wherein the location of the pressure stagnation point is indicated by a dashed circle PSP.

In an embodiment, the first and second gas showers may be separate gas shower units, or be parts of one gas shower unit. The first and second gas showers may be part of the same gas shower system, or of different gas shower systems. Together, the first and second gas showers may form a gas shower assembly. The first and second gas showers may be integrated with each other, connected to each other, be connected to the same gas supply or be connected to different gas supplies. The first and second gas showers may also be configured differently. One or more further gas showers may be provided, as will be clear to the skilled person.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning structure defines the pattern created on a substrate. The topography of the patterning structure may be pressed into a layer of resist supplied to the substrate whereupon the resist is cured by applying electromagnetic radiation, heat, pressure or a combination thereof. The patterning structure is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

The invention claimed is:

1. A lithographic apparatus, comprising:
a first gas shower configured to supply a first gas flow and a second gas flow to an interior space of the apparatus; and
a second gas shower configured to supply a third gas flow and a fourth gas flow to the interior space of the apparatus,
wherein the first and second gas showers are configured to direct the first gas flow and the third gas flow at least partly towards each other, and
wherein a shape of sides of an outlet of the first or the second gas showers is configured to produce a self-converging or a self-diverging gas flow to the interior space.

2. The apparatus of claim 1, further comprising:
a component that extends at least partially between the first and third gas showers.

3. The apparatus of claim 2, wherein the component is a mirror.

4. The apparatus of claim 1, further comprising:
an interferometer system configured to measure a displacement of a part of the apparatus utilizing one or more interferometer beams,
wherein the first gas shower is configured to supply at least part of the first gas flow to a region which is traversed by the one or more interferometer beams.

5. The apparatus of claim 4, further comprising:
a component of the apparatus that extends at least partially between the first and second gas showers and abuts or is located near the region that is traversed by the one or more interferometer beams.

6. The apparatus of claim 4, wherein the second gas shower is configured to supply at least part of the third gas flow to the region which is traversed by the one or more interferometer beams.

7. The apparatus of claim 4, wherein the first and second gas showers extend substantially parallel to at least one path of the one or more interferometer beams.

8. The apparatus of claim 4, wherein the part of the apparatus comprises:
a substrate support moveable in an X- and/or Y- direction with respect to a projection system.

9. The apparatus of claims 8, further comprising:
a mirror that extends at least partially between the first and second gas showers and is used to measure a displacement of the substrate support in a Z-direction.

10. The apparatus of claim 1, wherein the first and second gas showers are configured to supply the first and third gas flows respectively to the interior space.

11. The apparatus of claim 1, wherein the shape of the sides of the outlet of at least one of the first and second gas showers comprises a curved surface.

12. The apparatus of claim 1, wherein the shape of the sides of the outlet of at least one of the first and second gas showers comprises a concave surface.

13. The apparatus of claim 1, wherein the shape of the sides of the outlet of at least one of the first and second gas showers comprises a substantially flat surface.

14. The apparatus of claim 1, further comprising:
a substrate support moveable with respect to a projection system,
wherein the first gas shower, the second gas shower, or both, is configured to direct part of its respective gas flow at least partly in a same direction as a movement of the substrate support.

15. The apparatus of claim 1, wherein the first and second gas showers are configured to induce a flow wake in the interior space.

16. The apparatus of claim 15, wherein the flow wake is induced near a component that extends at least partially between the first and second gas showers.

17. The apparatus of claim 1, wherein the first gas shower, the second gas shower, or both, comprises:
a gas outlet side comprising a plurality of inclined gas passages.

18. The apparatus of claim 17, wherein the gas outlet side comprises:
a sheet having the plurality of inclined passages, each passage extending substantially obliquely through the sheet.

19. The apparatus of claim 18, wherein the sheet is a metal or alloy sheet and the passages are laser drilled passages, etched passages, passages manufactured by electric discharge machining, or any combination of the foregoing passages.

20. A lithographic apparatus, comprising:
an apparatus component having a first side and a second side facing away from the first side; and
a gas shower system comprising a first and second gas showers configured to supply a first gas flow at least partially towards the first side of the apparatus component, a second gas flow into an interior space of the lithographic apparatus, a third gas flow at least partially towards the second side of the apparatus component, and a fourth gas flow into the interior space and substantially parallel with the second gas flow,
wherein a shape of sides of an outlet of the first or the second gas showers is configured to produce a self-converging or a self-diverging gas flow towards the apparatus component.

21. The apparatus of claim 20, wherein the gas shower system comprises:
first and second gas showers which are configured to supply the first and third gas flows, respectively.

22. The apparatus of claim 21, wherein the apparatus component extends at least partially between the first and second gas showers of the gas shower system.

23. The apparatus of claim 21, wherein the first and second gas showers of the gas shower system extend substantially parallel to a path of an interferometer beam.

24. The apparatus of claim 21, wherein the first and second gas showers of the gas shower system are mirror symmetrical.

25. The apparatus of claim 21, wherein the apparatus component comprises:
a third side extending between the first and second sides,
wherein the gas shower system is configured so that at least part of the first and third gas flows meet each other in front of the third side of the apparatus component during use.

26. The apparatus of claim 20, wherein the apparatus component is a mirror.

27. The apparatus of claim 20, further comprising:
an interferometer system configured to measure a displacement of a part of the apparatus utilizing an interferometer beam,
wherein the gas shower system is configured to supply at least part of at least one of the first gas flow, the second gas flow, the third gas flow, or the fourth gas flow, to a region which is traversed by the interferometer beam.

28. The apparatus of claim 27, wherein the apparatus component abuts or is located near the region that is traversed by the interferometer beam.

29. The apparatus of claim 21, wherein the shape of the sides of the outlet of at least one of the first and second gas showers comprises a curved surface.

30. The apparatus of claim 21, wherein the shape of the sides of the outlet of at least one of the first and second gas showers comprises a concave surface.

31. The apparatus of claim 21, wherein the shape of the sides of the outlet of at least one of the first and second gas showers comprises a substantially flat surface.

32. The apparatus of claim 21, wherein at least one of the first and second gas showers is configured to supply a collimated gas flow towards the apparatus component.

33. A method for conditioning an interior space of a device manufacturing apparatus, comprising:
   supplying a first conditioned gas flow, a second conditioned gas flow, a third conditioned gas flow, and a fourth conditioned gas flow to the interior space, such that the first conditioned gas flow and the third conditioned gas flow are at least partly directed towards each other,
   wherein a shape of sides of an outlet producing the first or the third conditioned gas flow is configured to produce a self-converging or a self-diverging gas flow to the interior space.

34. The method of claim 33, wherein a part of the first gas flow and a part of the third gas flow meet each other near a component of the apparatus.

35. The method of claim 34, wherein the component is a mirror.

36. The method of claim 33, further comprising:
   directing an interferometer beam across a region of the interior space; and
   conditioning a path of the interferometer beam with the first gas flow, the third gas flow, or both.

37. The method of claim 36, wherein a component of the apparatus abuts or is located near the region that is traversed by the interferometer beam.

38. The method of claim 33, further comprising:
   directing the first gas flow towards a first side of a component of the apparatus; and
   directing the third gas flow towards a second side of the component of the apparatus, the first side and the second side of the component facing away from each other.

39. The method of claim 33, wherein the first and third gas flows induce a flow wake in the interior space.

40. The method of claim 33, wherein the first and second third gas flows induce a flow wake near a mirror surface of a mirror of the apparatus.

41. The method of claim 33, wherein at least a converging part of the first gas flow is directed
   towards a part of the third gas flow,
   towards a component of the apparatus, or both.

42. The method of claim 33, wherein at least a collimated part of the first gas flow is directed
   towards a part of the third gas flow,
   towards a component of the apparatus, or both.

43. The method of claim 33, wherein at least a diverging part of the first gas flow is directed
   towards a part of the third gas flow,
   towards a component of the apparatus, or both.

44. The method of claim 33, wherein at least a converging part of the first gas flow is directed
   to a converging part of the third gas flow,
   towards a component of the apparatus, or both.

45. The method of claim 33, wherein at least a converging part of the first gas flow is directed
   towards a collimated part of the third gas flow,
   towards a component of the apparatus, or both.

46. The method of claim 33, wherein a diverging part of the first gas flow and a diverging part of the third gas flow are directed
   toward each other,
   towards a component of the apparatus, or both.

47. The method of claim 33, wherein the interior space comprises at least part of a substrate zone of the apparatus.

48. A method for conditioning an interior space of a device manufacturing apparatus, comprising:
   at least partially directing a first gas flow towards a first side of an apparatus component;
   at least partially directing a second gas flow into the interior space of the device manufacturing apparatus;
   at least partially directing a third gas flow towards a second side of the apparatus component; and
   at least partially directing a fourth gas flow into the interior space of the device manufacturing apparatus substantially parallel with the second gas flow;
   wherein the second side faces away from the first side, and
   wherein a shape of sides of an outlet producing the first gas flow, the third gas flow, or both, is configured to produce a self-converging or a self-diverging gas flow.

49. The method of claim 48, wherein at least part of the first gas flow and at least part of the third gas flow meet each other in an area in front of a third side of the apparatus component, the third side extending between the first and second sides of the apparatus component.

50. The method of claim 49, wherein the third side of the apparatus component includes a mirror surface.

51. The method of claim 48, wherein an optical path of an interferometer beam extends in an area near the apparatus component and at least part of the first gas flow and at least part of the third gas flow are directed towards the optical path.

52. A lithographic apparatus, comprising:
   a first gas shower configured to supply a first gas flow and a second gas flow to an interior space of the apparatus; and
   a second gas shower configured to supply a third gas flow and a fourth gas flow to the interior space of the apparatus,
   wherein the first and second gas showers are configured to direct the first gas flow and the third gas flow at least partly towards each other,
   wherein the first and second gas showers are configured to direct the second gas flow and the fourth gas flow substantially parallel to each other, and
   wherein the first and third gas flows comprise high velocity gas and the second and fourth gas flows comprise low velocity gas.

* * * * *